(12) United States Patent
Mauri et al.

(10) Patent No.: US 11,385,306 B2
(45) Date of Patent: Jul. 12, 2022

(54) TMR SENSOR WITH MAGNETIC TUNNEL JUNCTIONS WITH SHAPE ANISOTROPY

(71) Applicant: Western Digital Technologies, Inc., San Jose, CA (US)

(72) Inventors: Daniele Mauri, San Jose, CA (US); Lei Wang, San Jose, CA (US); Yuankai Zheng, Fremont, CA (US); Christian Kaiser, San Jose, CA (US); Chih-Ching Hu, Pleasanton, CA (US); Ming Mao, Dublin, CA (US); Ming Jiang, San Jose, CA (US); Petrus Antonius Van Der Heijden, Cupertino, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 213 days.

(21) Appl. No.: 16/728,507

(22) Filed: Dec. 27, 2019

(65) Prior Publication Data
US 2021/0055360 A1    Feb. 25, 2021

Related U.S. Application Data

(60) Provisional application No. 62/891,177, filed on Aug. 23, 2019.

(51) Int. Cl.
*G01R 33/09* (2006.01)
*G01R 33/00* (2006.01)
*B82Y 25/00* (2011.01)

(52) U.S. Cl.
CPC ............ *G01R 33/098* (2013.01); *B82Y 25/00* (2013.01); *G01R 33/0094* (2013.01); *G01R 33/096* (2013.01)

(58) Field of Classification Search
CPC .... G01R 1/00; G01L 1/00; G01L 7/00; H01F 1/00; H01L 21/00; H01L 2221/00
See application file for complete search history.

(56) References Cited

U.S. PATENT DOCUMENTS

| 6,226,160 B1 | 5/2001 | Gallagher et al. |
| 6,882,145 B2 | 4/2005 | Ehresmann et al. |
| (Continued) | | |

OTHER PUBLICATIONS

Paulo P. Freitas et al.; "Spintronic Sensors" Proceedings of the IEEE; vol. 104, No. 10, pp. 1984-1918; Oct. 2016.
(Continued)

*Primary Examiner* — Jermele M Hollington
*Assistant Examiner* — Temilade S Rhodes-Vivour
(74) *Attorney, Agent, or Firm* — Patterson + Sheridan, LLP; Steven H. Versteeg

(57) ABSTRACT

Embodiments of the present disclosure generally relate to a sensor of magnetic tunnel junctions (MTJs) with shape anisotropy. In one embodiment, a tunnel magnetoresistive (TMR) based magnetic sensor in a Wheatstone configuration includes at least one magnetic tunnel junctions (MTJ). The MTJ includes a free layer having a first edge and a second edge. The free layer has a thickness of about 100 Å or more. The free layer has a width and a height with a width-to-height aspect ratio of about 4:1 or more. The MTJ has a first hard bias element positioned proximate the first edge of the free layer and a second hard bias element positioned proximate the second edge of the free layer.

20 Claims, 10 Drawing Sheets

(56) References Cited

U.S. PATENT DOCUMENTS

| | | |
|---|---|---|
| 7,061,731 B2 | 6/2006 | Larson et al. |
| 8,059,374 B2 | 11/2011 | Zhao et al. |
| 8,194,366 B1 | 6/2012 | Li et al. |
| 8,336,194 B2 | 12/2012 | Yuan et al. |
| 9,591,221 B2 | 3/2017 | Miller et al. |
| 9,596,995 B2* | 3/2017 | Fuji .................. G01L 1/2287 |
| RE46,428 E | 6/2017 | Mather et al. |
| 9,684,184 B2 | 6/2017 | Miller et al. |
| 2003/0179511 A1 | 9/2003 | Xiao et al. |
| 2007/0019338 A1 | 1/2007 | Childress et al. |
| 2014/0054733 A1 | 2/2014 | Deak et al. |
| 2014/0176132 A1* | 6/2014 | Chen .................. G01R 33/098 324/252 |
| 2015/0137292 A1* | 5/2015 | Khalili Amiri ......... H01L 43/10 257/421 |
| 2015/0185297 A1 | 7/2015 | Zimmer et al. |
| 2016/0011279 A1 | 1/2016 | Rasbornig et al. |
| 2016/0320459 A1 | 11/2016 | Mather et al. |
| 2017/0301855 A1* | 10/2017 | Zhang .................. G11C 11/161 |
| 2017/0322052 A1 | 11/2017 | Paul et al. |
| 2018/0158702 A1 | 6/2018 | Deak |
| 2019/0020822 A1 | 1/2019 | Sharma et al. |
| 2019/0245140 A1* | 8/2019 | Yu ........................... H01L 43/02 |
| 2019/0295615 A1* | 9/2019 | Fukuzawa .............. B82Y 25/00 |

OTHER PUBLICATIONS

MultiDimension Technology, "MDT Releases TMR2105 Magnetic Field Sensor with Large Dynamic Range" Sensors Midwest 2017; http://www.dowaytech.com/en/2039.html (2 pages).

Hiroshi Yamazaki et al.; "Characteristics of TMR Angle Sensors" TDK Corporation, SENSOR + TEST Conferences 2011—SENSOR Proceeding, pp. 361-365; https://www.ama-science.org/proceedings/getFile/AQLI (5 pages).

Zhengqi Lu et. al.; "Doubly Exchange-Biased FeMn/NiFe/Cu/NiFe/CrMnPt Spin Valves" IEEE Transactions on Magnetics, vol. 36, No. 5, pp. 2899-2901; Sep. 2000.

International Search Report Issued in corresponding International Patent Application No. PCT/US2020/025873, dated Jul. 17, 2020 (10 pages).

* cited by examiner

TMR SENSOR WITH MAGNETIC TUNNEL JUNCTIONS WITH SHAPE ANISOTROPY

CROSS-REFERENCE TO RELATED APPLICATIONS

This application claims benefit of U.S. provisional patent application Ser. No. 62/891,177, filed Aug. 23, 2019, which is hereby incorporated by reference.

BACKGROUND OF THE DISCLOSURE

Field of the Disclosure

Embodiments of the present disclosure generally relate to a sensor of magnetic tunnel junctions (MTJs) with shape anisotropy, more particularly to a sensor comprising a plurality of MTJs with shape anisotropy arranged in a Wheatstone configuration.

Description of the Related Art

Hall effect magnetic sensors are inexpensive, have large operating field range, have good linearity, but have low sensitivity. Magnetoresistive (MR) sensors, on the other hand, have much larger sensitivity (>100×) but are typically designed for low field applications less than 80 Oe. For some applications, there is a need for high sensitivity sensors with a working range above 80 Oe. For instance, the application may be suited for detection of fields in the plane of the sensor (as is the case for MR sensors) rather than fields perpendicular to the sensor plane (as is typical for Hall sensors).

Paulo P. Freitas et al., "Spintronic Sensors", Proceedings of the IEEE, vol. 104, issue 10 (October 2016) discloses an array of MTJs coupled in series to form a Wheatstone bridge MR sensor. Freitas et al. also discloses various applications for a Wheatstone bridge MR sensor. However, the Wheatstone bridge MR sensors of Freitas et al. are designed for low field applications.

Therefore, there is a need for an improved Wheatstone bridge MR sensor.

SUMMARY OF THE DISCLOSURE

Embodiments of the present disclosure generally relate to a sensor of magnetic tunnel junctions (MTJs) with shape anisotropy.

In one embodiment, a tunnel magnetoresistive (TMR) based magnetic sensor in a Wheatstone configuration includes at least one magnetic tunnel junctions (MTJ). The MTJ includes a free layer having a first edge and a second edge. The free layer has a thickness of about 100 Å or more. The free layer has a width and a height with a width-to-height aspect ratio of about 4:1 or more. The MTJ has a first hard bias element positioned proximate the first edge of the free layer and a second hard bias element positioned proximate the second edge of the free layer.

In another embodiment, a TMR based magnetic sensor in a Wheatstone configuration includes a plurality of magnetoresistance legs. Each magnetoresistance leg includes a plurality of MTJs coupled in series. At least one of the plurality of MTJs includes a free layer formed as a strip with a substantially single magnetic domain provided by shape anisotropy of the strip and by a first hard bias element at one end of the strip and a second hard bias element at another end of the strip of the free layer.

In still another embodiment, a TMR based magnetic sensor in a Wheatstone configuration includes two positive polarity magnetoresistance legs and two negative polarity magnetoresistance legs. Each positive polarity magnetoresistance leg includes a first plurality of MTJs coupled in series. Each negative polarity magnetoresistance leg comprising a second plurality of MTJs coupled in series. At least one of the MTJs of the first plurality of MTJs and at least one of the MJTs of the second plurality of MTJs each includes a free layer formed as a strip with a substantially single magnetic domain provided by shape anisotropy of the strip and by a first hard bias element at one end of the strip and a second hard bias element at another end of the strip. Each of the positive polarity magnetoresistance legs and each of the negative polarity magnetoresistance legs provides a substantially hysteresis-free response to an external magnetic field.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Certain embodiments are directed to a magnetoresistive element, such as a magnetic tunnel junction (MTJ), comprising a relatively thick free layer with shape anisotropy with hard bias stabilization. Such MTJs can be coupled together to form a tunnel magnetoresistive (TMR) based magnetic sensor in a Wheatstone configuration. The TMR based magnetic sensor can detect a large operating field range, such as operating fields in the hundreds Oe range to a few thousands Oe range. The MTJs can have a substantially hysteresis-free response. The TMR based magnetic sensor can have a substantially hysteresis-free response and a high linear response (i.e., low linearity ratio) to a desired range of sensed magnetic fields.

Figure 1:
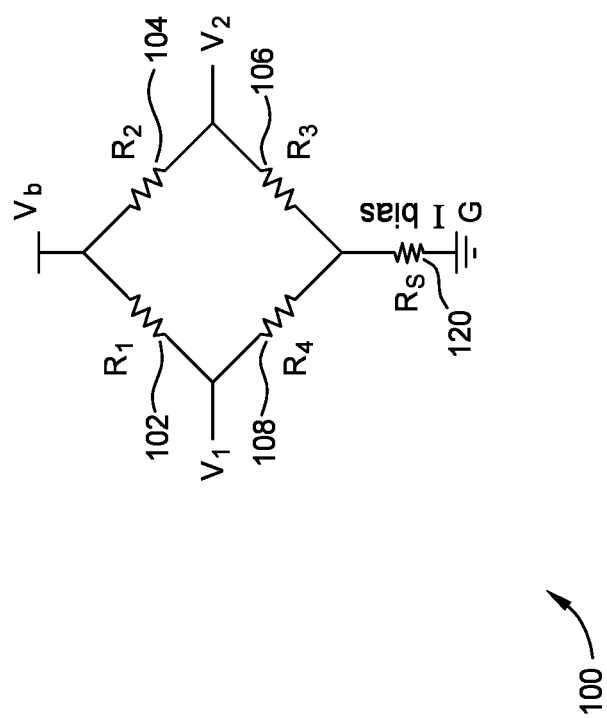
FIG. 1 is a circuit diagram illustrating certain embodiments of a tunnel magnetoresistive based magnetic sensor in a Wheatstone configuration.

FIG. 1 is a circuit diagram illustrating certain embodiments of a TMR based magnetic sensor 100 in a Wheatstone configuration. The TMR based magnetic sensor 100 can include four variable resistor legs of a first magnetoresistance leg 102, a second magnetoresistance leg 104, a third magnetoresistance leg 106, and a fourth magnetoresistance leg 108 arranged in a Wheatstone configuration. Terminal Vb and terminal G are used to provide a bias voltage/current from Vb to G. Terminals V1 and V2 are used to measure signals of the voltage difference between V1 and V2 representing a sensed magnetic field. Terminals V1 and V2 may be coupled to an optional amplifier to amplify the signal. The TMR based magnetic sensor 100 may optionally include a series resistor 120 which can be used to adjust the DC level of V1 and V2.

Neighboring magnetoresistance legs are formed to opposite polarity. For example, the first magnetoresistance leg 102 and the third magnetoresistance leg 106 can have a positive response to a sensed magnetic field and the second magnetoresistance leg 104 and the fourth magnetoresistance leg 108 can have a negative response to the sensed magnetic field. In another example, the first magnetoresistance leg 102 and the third magnetoresistance leg 106 can have a negative response to a sensed magnetic field and the second magnetoresistance leg 104 and the fourth magnetoresistance leg 108 can have a positive response to the sensed magnetic field.

The TMR based magnetic sensor 100 in a Wheatstone configuration provides double the signal based upon the same sensing bias current in comparison to a sensor with a single magnetoresistance leg. The TMR based magnetic sensor 100 in a Wheatstone configuration has reduced impact to thermal drifts in comparison to a sensor with a single magnetoresistance leg. Although the TMR based magnetic sensor 100 of FIG. 1 is shown in a full Wheatstone configuration with four variable resistor legs, in other embodiments the TMR based magnetic sensor can comprise a quarter Wheatstone bridge configuration with one variable resistor leg and three fixed resistor legs or a half Wheatstone bridge configuration with two variable resistor legs and two fixed resistor legs.

Figure 2:
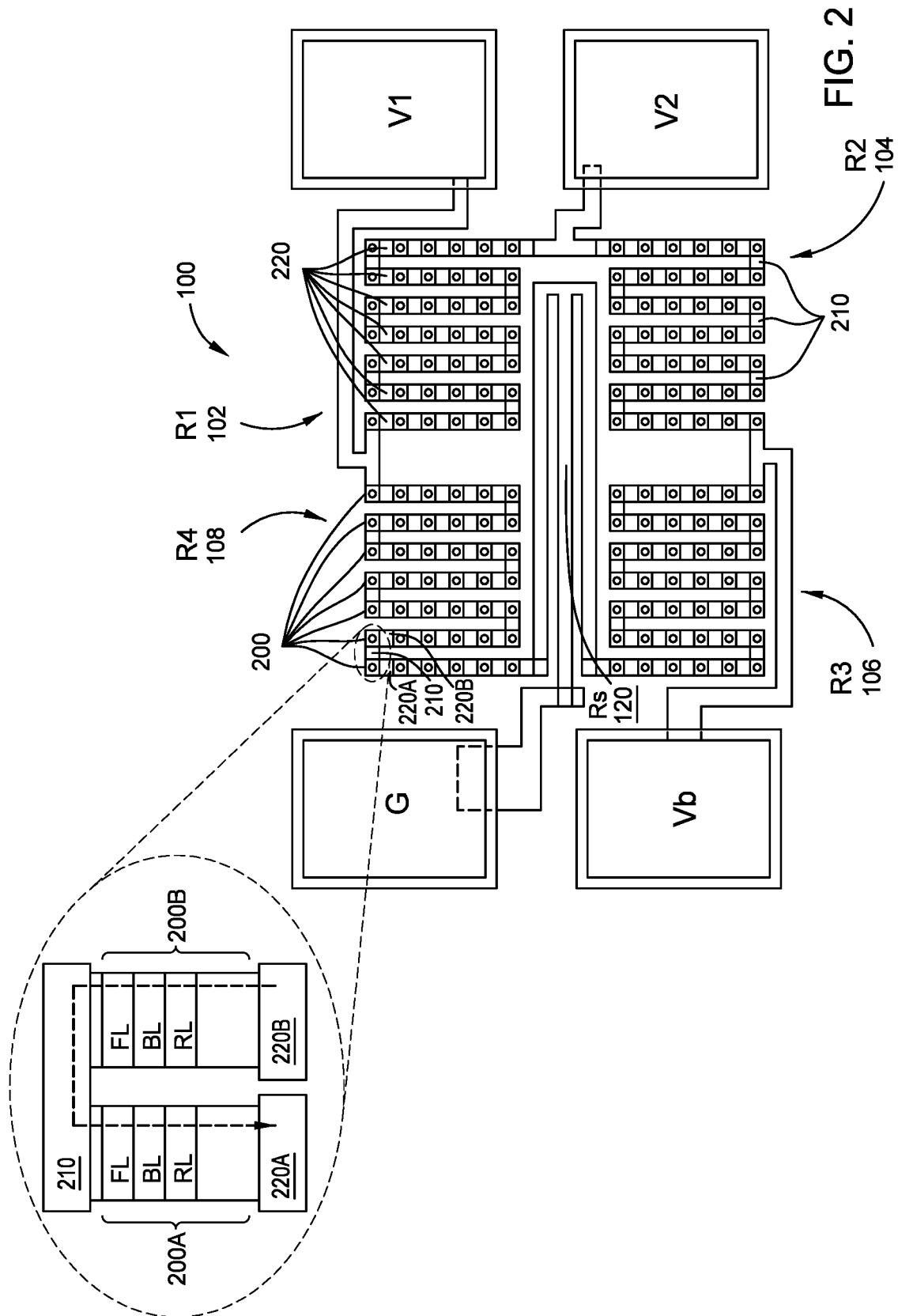
FIG. 2 is a schematic plan view of a layout illustrating certain embodiments of a TMR based magnetic sensor in a Wheatstone configuration of FIG. 1.

FIG. 2 is a schematic plan view of a layout illustrating certain embodiments of the TMR based magnetic sensor 100 in a Wheatstone configuration of FIG. 1. For ease of description, FIG. 2 includes like numerals as used in FIG. 1. As shown in FIG. 2, each of the four magnetoresistance legs 102, 104, 106, 108 comprises a string of MTJs 200 coupled in series. The MTJs 200 in a magnetoresistance leg are coupled together by a plurality of top electrodes 210 and a plurality of bottom electrodes 220. In certain embodiments, each magnetoresistance leg 102, 104, 106, 108 individually comprises from 10 to 100 MTJs, such as from 20 to 50 MTJs. In certain embodiments, the TMR based sensor 100 can be made to occupy a surface area from about 0.1 mm$^2$ to about 50 mm$^2$.

In one aspect, MTJs 200 connected in series reduce the overall noise of the sensed magnetic field for the same signal level in comparison to a leg composed of a single MTJ. For example, the insert shows an enlarged cross-sectional view of certain embodiments of two MTJs 200A, 200B formed after patterning. The two MTJs 200A, 200B are coupled in series sharing the same top electrode 210 with different bottom electrodes 220A, 220B with an electron current flow as shown in the dotted lined.

Noise in the MTJ may arise from electrical sources, like charge trapping in the MTJ barrier, or magnetic sources such as thermally activated local magnetization angle changes. Since the noise in each MTJ is essentially uncorrelated, the series connection of MTJs 200 reduces the overall noise. In another aspect, MTJs 200 connected in series reduce the voltage drop across each individual MTJ 200 improving reliability of the TMR based magnetic sensor in comparison to a leg composed of a single MTJ. For example, a barrier layer of a MTJ has a certain lifetime based upon the total voltage across the MTJ. By spreading the voltage drop across a plurality of MTJs 200, the voltage drop across a single MTJ from the plurality of MTJs 200 is reduced. The reduced voltage drop across each MTJ increases the lifetime and reliability of each MTJ 200 and thus increases the lifetime and reliability of the sensor 100 as well.

Other layouts of a TMR based sensor are possible, such as other layouts of MTJs in series and/or in parallel, other layouts of the electrodes, and other layouts of the terminals.

Figure 3:
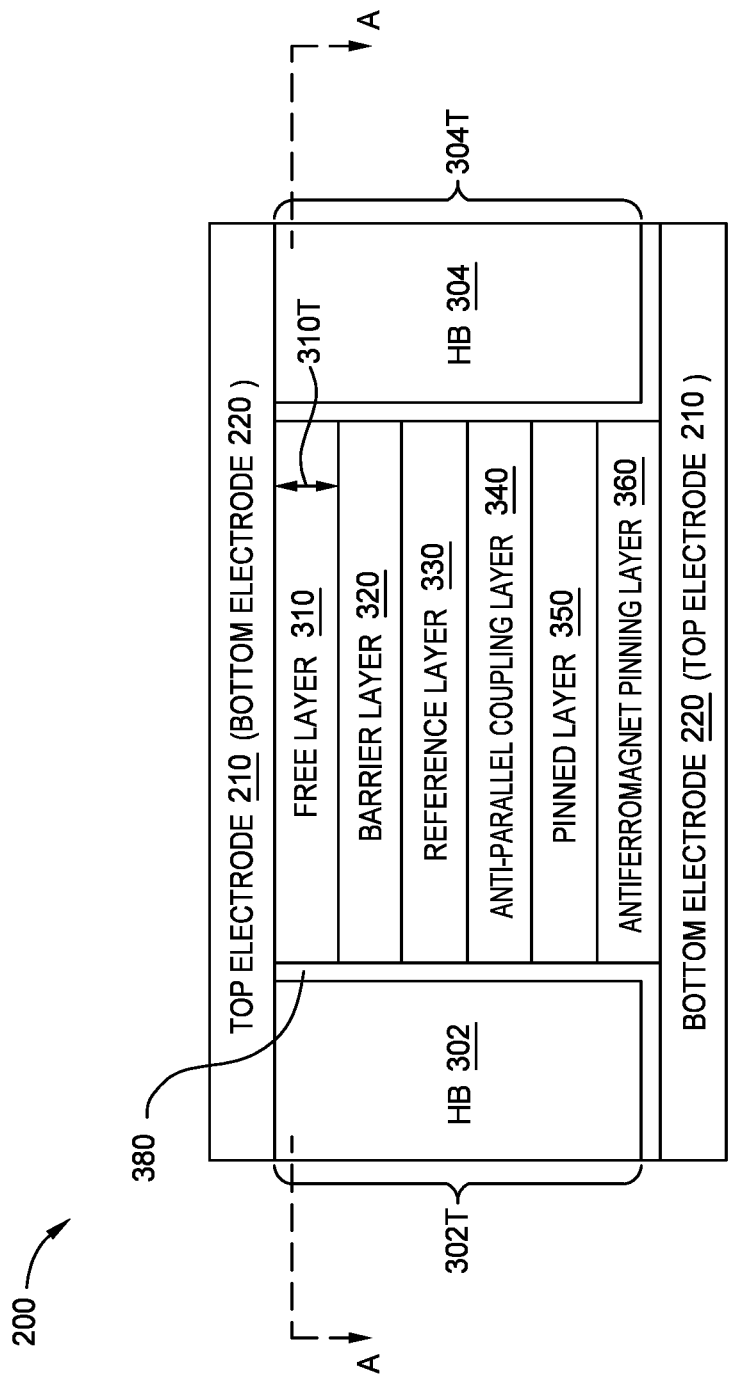
FIG. 3 is a schematic side view illustrating certain embodiments of a single MTJ.

FIG. 3 is a schematic side view illustrating certain embodiments of a single MTJ 200, such as one of the MTJs 200 of FIG. 2. The single MTJs 200 can be used in the plurality of MTJs connected in series forming the magnetoresistance legs of TMR based magnetic sensor 100 of FIG. 2 or other suitable TMR based magnetic sensors. For ease of description, FIG. 3 includes like numerals as used in FIG. 2.

The MTJ 200 comprises a free layer 310, a barrier layer 320, a reference layer 330, an antiparallel (AP) coupling layer 340, a pinned layer 350, and an antiferromagnetic (AFM) pinning layer 360. The MTJ 200 may be bottomed pinned with the AFM pinning layer 360 proximate the bottom electrode 220 and the free layer proximate a top electrode 210 or may be topped pinned with the AFM pinning layer 360 proximate a top electrode 210 and the free layer proximate a bottom electrode 220.

As shown in FIG. 3, the pinned layer 350, the AP coupling layer 340, and the reference layer 330 form a synthetic antiferromagnetic (SAF) pinned structure. In other embodiments, the MTJ 200 may comprise a simple pinned structure or may comprise two or more SAF pinned structures. The MTJ 200 may include other layers, such as seed layer(s) (not shown), capping layer(s) (not shown), contact layers, and other pinning structures.

The free layer 310 can comprise single or multiple layers of CoFe, NiFe, other ferromagnetic materials, and combinations thereof. The barrier layer 320 can comprise single or multiple layers of magnesium oxide, aluminum oxide, other dielectric materials, and combinations thereof. The reference layer 330 can comprise single or multiple layers of CoFe, other ferromagnetic materials, and combinations thereof. The antiparallel (AP) coupling layer 340 can comprise single or multiple layers of Ru, Ru alloys other non-magnetic materials, and combinations thereof. The pinned layer 350 can comprise single or multiple layers of CoFe, CoB, CoFeB, other ferromagnetic materials, and combinations thereof. The antiferromagnetic (AFM) pinning layer 360 can comprise single or multiple layers of PtMn, NiMn, IrMn, IrMnCR, other antiferromagnetic materials, and combinations thereof.

The AFM pinning layer 360 has a fixed magnetization that in turn substantially fixes the magnetic moment of the pinned layer 350. The reference layer 330 is antiparallel coupled with the first pinned layer 350 across the antiparallel coupling layer 340. Accordingly, the magnetization of the reference layer 330 is oriented in a second direction that is antiparallel to the direction of the magnetization of the pinned layer 350. In certain embodiments, the reference layer 330 is formed to be about 90° to the free layer 310. In certain embodiments, the reference layer 330 is formed to be over 90° to the free layer 310 to increase the field sensitivity of the MTJ 200.

The free layer 310 of the MTJ 200 rotates from its easy axis to its hard axis in the presence of a sensed magnetic field. The rotation of the free layer 310 relatively to the reference layer 300 changes the resistance of the MTJ 200. For example, the resistance of the MTJ 200 with the free layer 310 and the reference layer 330 in an anti-parallel state can be three times higher than the free layer 310 and the reference layer 330 in a parallel state. In certain operating magnetic field ranges, magnetization of the free layer 310 can rotate while the magnetization directions of the reference layer 330 and the pinned layer 350 are substantially unrotated by external magnetic fields.

In certain embodiments, the free layer 310 has a relatively large thickness 310T of about 100 Å or more, such as from about 200 Å to about 1,000 Å. The larger the thickness of the free layer 310 is correlated to a larger magnetic saturation field ($H_k$ eff) which determines the operating field range of the MTJ. The MTJ 200 and thus a TMR based magnetic sensor comprising a plurality of the MTJs 200 can operate over large field ranges, such as in the hundreds Oe range to a few thousands Oe range. Prior art MTJs typically operate over small field ranges, such as ±80 Oe. In certain embodiments, a TMR based magnetic sensor comprising a plurality of the MTJs 200 in a Wheatstone configuration can operate over large external magnetic field ranges, such over a magnetic field range of ±150 Oe, such as ±600 Oe, such as ±1,000 Oe, or such as ±2,000 Oe. In certain embodiments, a TMR based magnetic sensor comprising a plurality of the MTJs 200 in a Wheatstone configuration can operate over large external magnetic field ranges added to a constant DC field, such over a magnetic field range of ±150 Oe superimposed over a constant DC field, such as ±600 Oe superimposed over a constant DC field, such as ±1,000 Oe superimposed over a constant DC field, or such as ±2,000 Oe superimposed over a constant DC field.

A relatively thick free layer may undesirably form multiple magnetic domains which would undesirably provide a hysteresis response for the MTJ. In certain embodiments, the MTJ 200 is formed to have shape anisotropy and to have hard bias stabilization to provide a thick free layer with a substantially single magnetic domain.

In certain embodiments, the MTJ 200 further has hard bias (HB) elements 302, 304 formed proximate the ends of the free layer 310. The hard bias elements 302, 304 comprise a single layer or multiple layers of cobalt, a cobalt alloy (such as CoPt or CoPtCr), other hard magnetic materials, or combinations thereof. In certain embodiments, pinned layered structures (not shown) may be formed proximate the hard bias elements 302, 304 to stabilize the magnetic moment of the hard bias elements 302, 304.

In certain embodiments, the MTJ 200 further has an insulation layer 380 formed between the HB elements 302, 304 and the free layer 310. The insulation layer 380 comprises aluminum oxide, magnesium oxide, and other non-electrically conducting materials. For example, the insulation layer can be formed to a thickness of about 5 nm or less by atomic layer deposition or other deposition processes. The insulation layer 380 prevents or reduces electrical shunting of the bias current through the HB elements 302, 304 rather than through the barrier layer 320.

Figure 4:
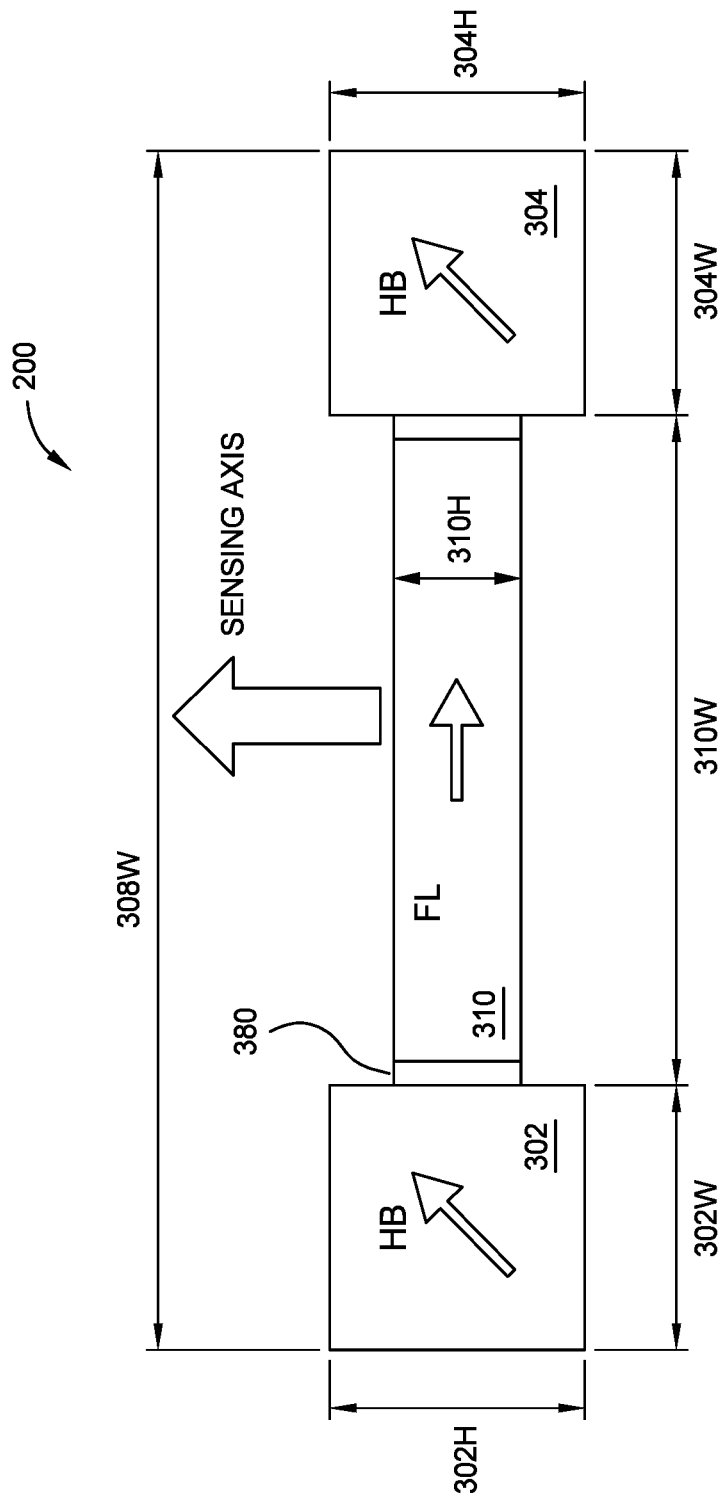
FIG. 4 is a schematic cross-sectional view illustrating certain embodiments of a single MTJ of FIG. 3.

FIG. 4 is a schematic cross-sectional view illustrating certain embodiments of a single MTJ 200 of FIG. 3 through plane A-A. For ease of description, FIG. 4 includes like numerals as used in FIG. 3. The MTJ 200 comprises a relatively thick free layer 310 with shape anisotropy.

Shape anisotropy of the relatively thick free layer 310 is provided by an aspect ratio (width-to-height) of the free layer 310 with a narrow height (310H) in the direction of the magnetic field to be sensed (i.e., the short axis of the MTJ 200 is aligned with the sensing field) and with a large width (310W) in a orthogonal direction to the sensing direction. For example, a free layer 310 formed as a rectangular strip, as shown in FIG. 4, provides shape anisotropy. The free layer 310 with shape anisotropy can be other polygonal strips, such as other trapezoid shapes or other quadrilateral shapes.

In certain embodiments, the free layer 310 is formed to a width 310W and to a height 310H in a width-to-height ratio of about 4:1 or more, such as from about 7:1 to about 25:1. In certain embodiments, the width 310W of the free layer 310 can be formed from about 1 μm to about 10 μm and the height 310H of the free layer can be formed from about 0.2 μm to about 2 μm. The free layer 310 with a width-to-height ratio of about 4:1 or more has a substantially single magnetic domain initially aligned in a general direction along the width 310W of the free layer 310 of the MTJ 200. The long width 310W helps to control magnetic domain formation to be along the length of the width.

For a free layer 310 with a high aspect ratio, the magnetization of the free layer will respond to or rotate to an external magnetic field up to a saturation field given by following approximation (1):

$$H{\rm sat}=4\pi M_{FL}*tFL/H \qquad (1)$$

in which H is the height of the free layer, tFL is thickness of the free layer, $M_{FL}$ is the saturation magnetization of the free layer material of a permalloy assumed to be about 700 Oe. The dynamic range of the MTJ, and thus the sensor, can be varied by changing the thickness 310T (FIG. 3) of the free layer and the height 310H (FIG. 4) of the free layer. The magnetic saturation field ($H_k$ eff) scales approximately with the inverse of the height 310H of the free layer 310. The smaller the height 310H of the free layer 310 the larger the sensed magnetic field which causes magnetic saturation of the free layer 310. The $H_k$ eff can by determined by plotting the resistance response of the MTJ from a near zero sensed magnetic field to a maximum resistance response.

Shape anisotropy of the relatively thick free layer 310 is further aided by the hard bias elements 302/304 at the ends of the strip of the free layer 310. HB elements 302, 304 formed proximate the ends of the strip of free layer 310 can reduce or prevent undesirable magnetic domain formations in a direction along the height 310H at the ends of the strip of the free layer 310 and can reduce or prevent other non-desirable magnetic domain formations. Hard bias elements 302, 304 are positioned proximate the edges or ends of the strip of the free layer 310 to stabilize the magnetic moment of the free layer 310. At the edges of the free layer 310, there is a large amount of demagnetizing energy due to the relatively thick free layer 310. Without the hard bias elements 302, 304, the magnetization at the ends of free layer 310 resist alignment along the width 310W and prefer alignment along the height 310H of the free layer 310. Without the hard bias elements 302, 304, the sensed magnetic field of the free layer 310 may result in a hysteretic bridge output. Without the hard bias elements 302, 304, the sensed magnetic field may result in moving domain walls instead of rotation of the magnetization domain of the free layer 310. The hard bias elements 302, 304 can help to provide a free layer 310 to operate with a single magnetic domain by providing continuous magnetization energy at the edge of the free layer 310.

Figure 12:
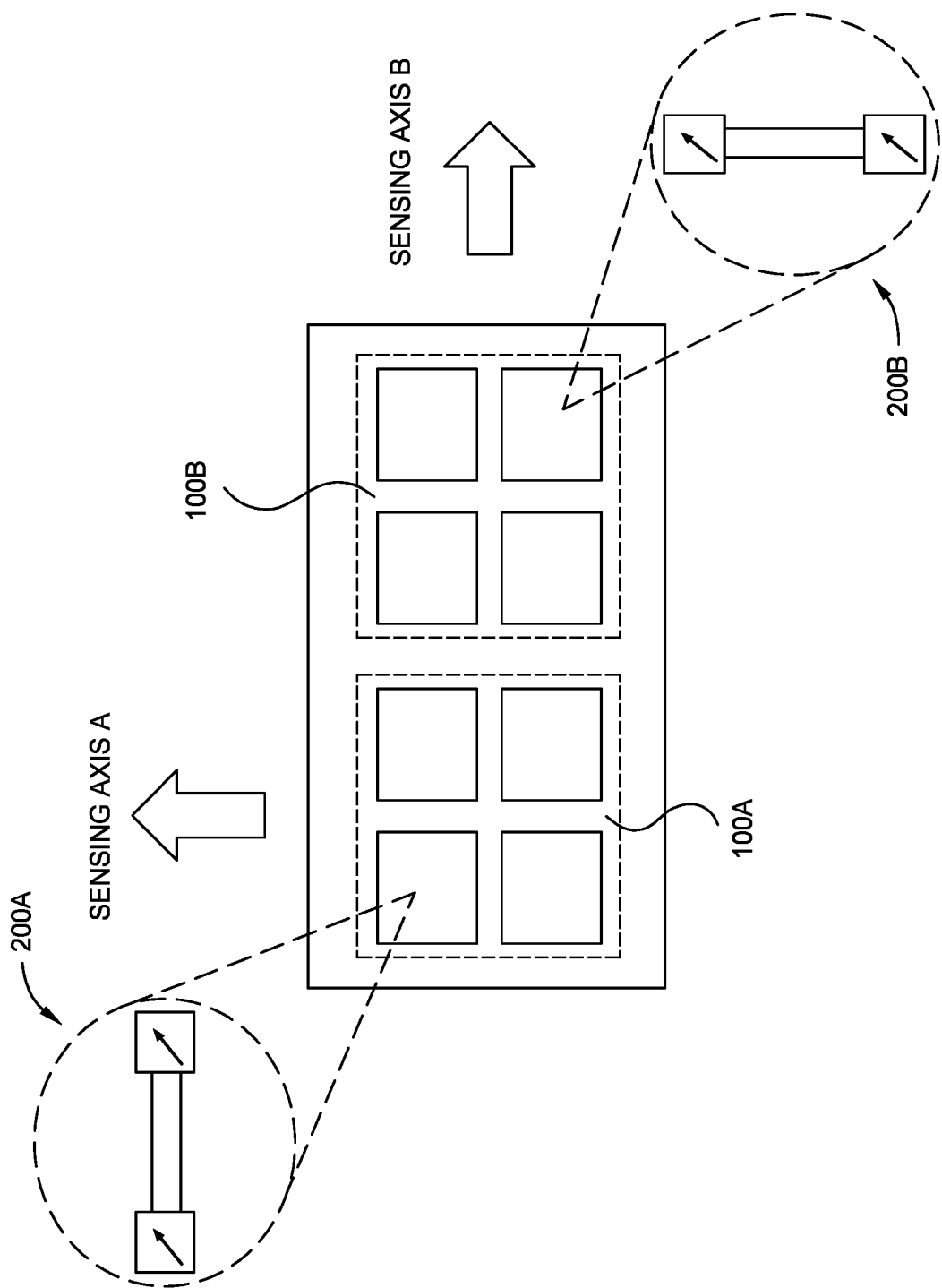
FIG. 12 is a schematic plan view of a layout illustrating certain embodiments of two TMR based magnetic sensors in a Wheatstone configuration on a single die.

In certain embodiments, the magnetic moment of the hard bias elements 302, 304 are set at an angle to the direction of the width 310W of the free layer 310. The hard bias elements 302, 304 set at an angle to the direction of the width 310W of the free layer 310 can be used on a die having one TMR based magnetic sensor 100 in a Wheatstone configuration, such as in FIG. 2, or on a die having two or more TMR based magnetic sensors 100 in a Wheatstone configuration. FIG. 12 is a schematic plan view of a layout illustrating certain embodiments of two TMR based magnetic sensors 100A, 100B in a Wheatstone configuration on a single die. Sensor 100A and sensor 100B senses two orthogonal field directions of sensing axis A and sensing axis B. The magnetization direction of the hard bias elements 302, 304 of each of the MTJs 200A of sensor 100A and the MTJs 200B of sensor 100B are set at the same angle between the two sensing axes (such as at 45°) to stabilize both sensors 100A, 100B. Angled hard bias elements 302, 304 for each of the MTJs of the magnetoresistance legs can be formed by applying an initialization field larger than the coercivity field of the hard magnet, in any desired angle. This magnetic initialization is typically applied at the end of wafer fabrication.

A full micromagnetic simulation was employed to estimate the amount of hard bias moment required for magnetic domain control of the free layer 310. Hysteresis-free response of the free layer 310 comprises a HB stabilization satisfying the following approximate condition (2):

$$M_{HB}\|*t_{HB} \geq 1.4*M_{FL}*t_{FL} \qquad (2)$$

in which $M_{HB}\|$ is the HB magnetization (for example in emu/cm$^3$) parallel to the easy axis (i.e. the long axis) of one of the HB elements 302, 304 in the strip direction, $t_{HB}$ is the thickness 302T, 304T of one of the HB elements 302, 304 (FIG. 3), $M_{FL}$ is the magnetization of the free layer 310, and $t_{FL}$ is the thickness 310T of the free layer 310. The moment thickness product ($M_{HB}\|*t_{HB}$) of one of the HB elements 302, 304 should be 1.4 times or more larger than the moment thickness product of the free layer.

In certain embodiments, the heights 302H, 304H of the hard bias elements 302, 304 is approximately the same height 310H as the free layer 310 due to the HB elements 302, 304 following the dimension of a mask used to define the MTJ 200.

In certain embodiments, the MTJ 200 and HB elements 302, 304 have a total combined width 308W from about 1 μm to about 20 μm.

Figure 5A:
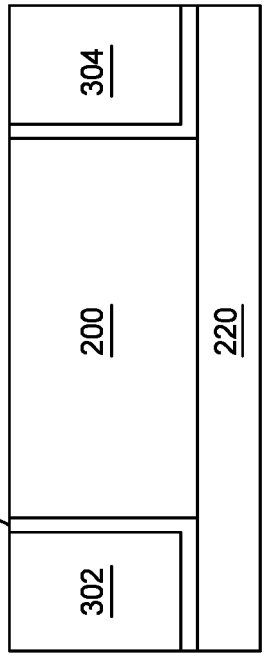
FIGS. 5A-5D are schematic side views illustrating certain embodiments of a method of fabricating a single MTJ of FIG. 3 with hard bias elements in a self-aligned process
Figure 5C:
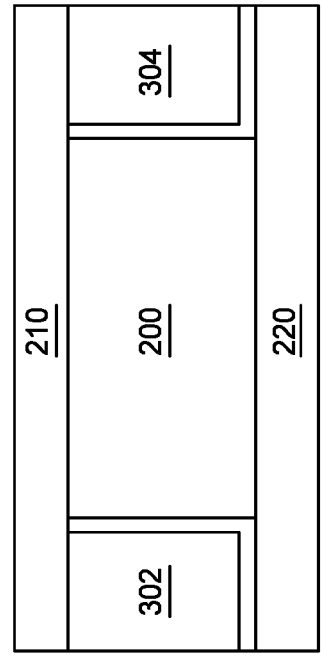
Figure 5B:
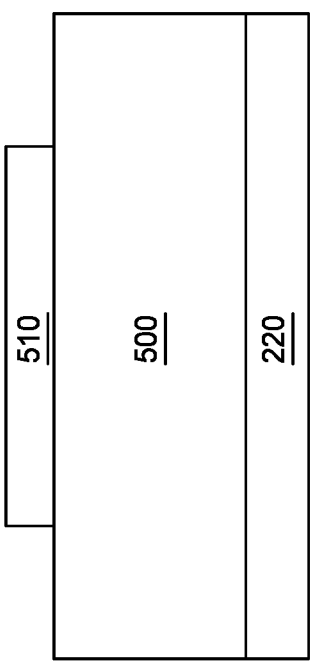
Figure 5D:
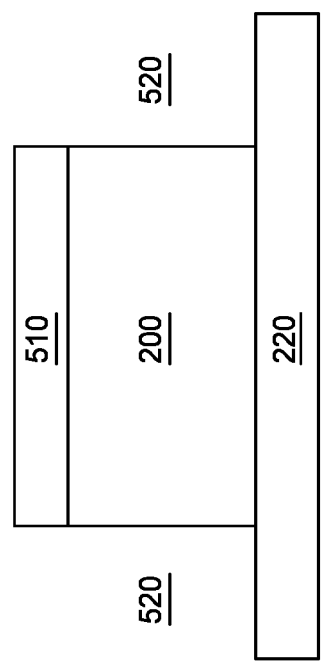

FIGS. 5A-5D are schematic side views illustrating certain embodiments of a method of fabricating the single MTJ 200 of FIG. 3 with HB elements 302/304 in a self-aligned process. For ease of description, FIGS. 5A-5D include like numerals as used in FIG. 3. FIG. 5A shows a TMR film stack 500 formed over a bottom electrode 220. A mask 510 is formed and patterned over the TMR film stack 500. The mask 510 can comprise one or more photoresist layers, one or more hard mask layers, or combinations thereof. FIG. 5B shows ion milling or etching of the TMR film stack 500 by masking of a portion of the TMR film stack 500 by mask 510 to form voids 520 defining a MTJ 200. FIG. 5C shows an insulation layer 380 formed, such as by atomic layer deposition, over the voids 520 along the sidewalls of the MTJ 200. A HB layer is deposited over the insulation layer 380, such as by physical vapor deposition. An etch-back and/or planarization process can be performed to remove portions of the HB layer to form HB elements 302/30. The mask 510 is removed as well, such as with the etch-back and/or planarization process or with an ashing process. FIG. 5D shows forming a top electrode 210, such as by physical vapor deposition, over the MTJ 200. The method of fabricating a single MTJ as shown in FIGS. 5A-5D shows formation of the HB elements 302/304 in a self-aligned process with the MTJ 200. The self-aligned process utilizes the same mask 510 for defining the MTJ from the TMR stack 500 and for defining the HB elements 302/304. In certain aspects, the self-aligned process allows tight/narrow spacing of the HB elements 302/304 in relation to the MTJ 200 to aid the shape anisotropy to the MTJ 200. In other embodiments, different fabricating processes than those shown in FIGS. 5A-5D can be used to fabricate the MTJ 200 in a self-aligned process with the same mask to define the MTJ 200 and the HB elements 302, 304.

The MTJs 200 of FIGS. 3-5 and 12 can be fabricated in an array to form the magnetoresistance legs 102, 104, 106, 108 of FIGS. 1-2 and 12. One example of fabricating magnetoresistance legs of opposite polarities is to form a positive polarity leg with a plurality of first MTJs and to form a negative polarity leg with a plurality of second MTJs in which the first MTJs and the second MTJs comprises two different film stacks having different resistance area products. Another example of fabricating magnetoresistance legs of opposite polarities is to form a positive polarity leg and a negative polarity leg with the MTJs of a single film stack with signal polarity controlled by thermal reset. In either method, the magnetoresistance legs of opposite polarities can be fabricated on the same wafer substrate. In other words, four magnetoresistance legs 102, 104, 106, 108 can be fabricated on the same wafer substrate by depositing the same film stack or by depositing different films stacks making up each MTJ.

A TMR based magnetic sensor 100 in a Wheatstone configuration of FIGS. 1-2 and 12 comprising the MTJs 200 of FIGS. 3-5 and 12 can have a signal/voltage output of the bridge to be zero at a desired sensed magnetic field. For example, a TMR based magnetic sensor 100 can have a signal/voltage output of the bridge to be zero at a zero sensed magnet field. In another example, a TMR based magnetic sensor 100 can have a signal/voltage output of the bridge to be zero at a desired non-zero sensed magnet field (such as at a sensed magnetic field of from about 300 Oe to about 500 Oe). A TMR based magnetic sensor 100 having a signal/voltage output of the bridge at zero at a desired non-zero sensed magnet field can be fabricated by adding magnetically insensitive resistors in selected legs of the bridge. For example, for a TMR based magnetic sensor 100 having a signal/voltage output of the bridge at zero at a zero sensed magnet field, the working range of the sensor in certain embodiments is from about −600 Oe to about +600 Oe. In another example, for a TMR based magnetic sensor 100 having a signal/voltage output of the bridge at zero at about −450 Oe sensed magnet field of a constant DC field, the working range of the sensor in certain embodiments is ±600 Oe superimposed over the constant DC field, in other words from about −1050 Oe to about +150 Oe.

In certain embodiments, a TMR based magnetic sensor 100 in a Wheatstone configuration of FIGS. 1-2 and 12 comprised of the MTJs 200 of FIGS. 3-5 and 12 can have a linearity ratio of about 1% or less for a TMR ratio of about 200% or less over a magnetic field range of ±600 Oe from a bridge signal/voltage output of zero. Linearity is one parameter to determine the performance of a TMR sensor. Linearity is a measure of the deviation of the bridge response from a pure linear response. Linearity as used herein is defined as a ratio of the maximum deviation from a straight line fit of the data over the desired field range divided by the total signal range over the desired field. A lower linearity ratio corresponds to a more linear sensor response.

In certain embodiments, the MTJs 200 of FIGS. 3-5 and 12 have shape anisotropy provided by a high width-to-height aspect ratio of the free layer and aided by hard bias elements. The MTJs with shape anisotropy each operate with a substantially single magnetic domain which rotates in the presence of a large external variable magnetic field, such as a variable magnetic field of ±600 Oe on top of a zero or non-zero DC field. Due to the shape anisotropy, rotation of the free layer and thus the signal response of the TMR based sensor comprising the MTJs is substantially hysteresis-free. A TMR based magnetic sensor 100 of FIGS. 1-2 and 12 comprising the MTJs 200 of FIGS. 3-5 and 12 can be fabricated to sense a variable magnetic field on top of a constant DC field, such as a working range offset from the constant DC field.

A TMR based magnetic sensor 100 of FIGS. 1-2 and 12 comprises at least one of MTJs 200 of FIGS. 3-5 and 12 with shape anisotropy. For example, the TMR based magnetic sensor can comprises a plurality of MTJs in which one, a minority of, a majority of, or all of the MTJs have shape anisotropy. FIGS. 3-5 and 12 illustrate a MTJ 200 with shape anisotropy aided by HB elements 302, 304. In certain embodiments, neighboring MTJs 200 with shape anisotropy may share one or both HB elements 302, 304.

In one embodiment, the TMR sensor 100 of FIGS. 1-2 and 12 comprising at least one of the MTJs of FIGS. 3-5 and 12 with shape anisotropy is used in a camera operating as a single axis sensor. An example of such a sensor is found in United States Patent Application Publication No.: 2019/0020822 A1, which is incorporated herein by reference. However, it is contemplated that the TMR sensor 100 may be utilized as a two dimensional or even a three dimensional sensor. Additionally, it is contemplated that TMR sensor 100 may be integrated and utilized in inertial measurement unit technologies other than cameras such as wearable devices, compasses, and MEMS devices. Furthermore, the TMR sensor 100 may operate as a position sensor, a bridge angular sensor, a magnetic switch, a current sensor, or combinations thereof. The TMR sensor 100 may be used to focus a camera such as a smart phone camera by using the TMR sensors as position and angular sensors. Also, the TMR sensor 100 has applicability in the automotive industry as switch, current, and angular sensors to replace current Hall, anisotropic magnetoresistance (AMR) and giant magnetoresistance (GMR) sensors. TMR sensor 100 can also be used in the drones and robotics industry as position and angular sensors. Medical devices can also utilize the TMR sensor 100 for flow rate control for infusion systems and endoscope camera sensors among others. Thus, the TMR sensor 100 discussed herein has applications well beyond smart phone cameras and thus should not be limited to use as sensors for smart phone cameras. Furthermore, the MTJs of the TMR sensor 100 need not be arranged in a Wheatstone bridge arrangement, but rather, may be arranged in any number of manners.

In one embodiment, a tunnel magnetoresistive (TMR) based magnetic sensor in a Wheatstone configuration includes at least one magnetic tunnel junctions (MTJ). The MTJ includes a free layer having a first edge and a second edge. The free layer has a thickness of about 100 Å or more. The free layer has a width and a height with a width-to-height aspect ratio of about 4:1 or more. The MTJ has a first hard bias element positioned proximate the first edge of the free layer and a second hard bias element positioned proximate the second edge of the free layer.

In another embodiment, a TMR based magnetic sensor in a Wheatstone configuration includes a plurality of magnetoresistance legs. Each magnetoresistance leg includes a plurality of MTJs coupled in series. At least one of the plurality of MTJs includes a free layer formed as a strip with a substantially single magnetic domain provided by shape anisotropy of the strip and by a first hard bias element at one end of the strip and a second hard bias element at another end of the strip of the free layer.

In still another embodiment, a TMR based magnetic sensor in a Wheatstone configuration includes two positive polarity magnetoresistance legs and two negative polarity magnetoresistance legs. Each positive polarity magnetoresistance leg includes a first plurality of MTJs coupled in series. Each negative polarity magnetoresistance leg comprising a second plurality of MTJs coupled in series. At least one of the MTJs of the first plurality of MTJs and at least one of the MJTs of the second plurality of MTJs each includes a free layer formed as a strip with a substantially single magnetic domain provided by shape anisotropy of the strip and by a first hard bias element at one end of the strip and a second hard bias element at another end of the strip. Each of the positive polarity magnetoresistance legs and each of the negative polarity magnetoresistance legs provides a substantially hysteresis-free response to an external magnetic field.

EXAMPLES

The following examples show data of certain embodiments of MTJs and a sensor comprising a plurality of MTJs. Such data should not be used to limit the scope of the claims unless explicitly set forth in the claims.

Example 1

Figures 6, 7:
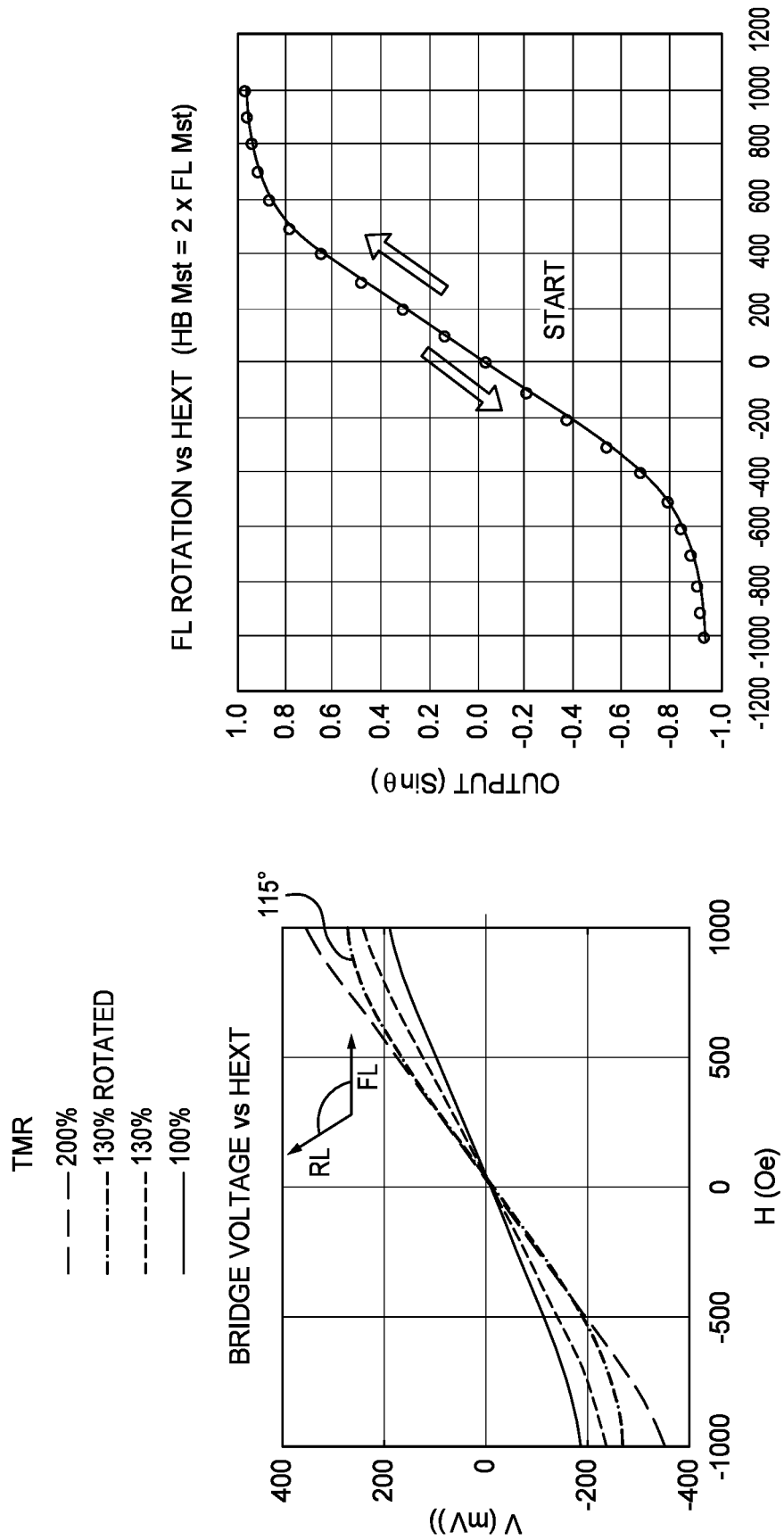
FIG. 6 shows a simulation illustrating a bridge output versus sensing field of a full Wheatstone bridge sensor using MTJs of FIG. 4.
FIG. 7 shows an average magnetization rotation of a free layer in a MTJ with free layer and hard bias elements satisfying the condition (2) under micromagnetic simulation.

FIG. 6 shows a simulation illustrating a bridge output versus sensing field of a full Wheatstone bridge sensor using the MTJs 200 of FIG. 4. The resistance of each leg of the Wheatstone bridge at a zero external magnetic field to be sensed was about 2,000 Ohm. A bias current applied to the sensor was 1 mA. The simulation assumed single domain magnetization rotation of the free layer for each MTJ.

For a fixed sensing current, the field sensitivity dV/dH (in mV/Oe) depends on the TMR ratio of the MTJ. TABLE 1 shows the field sensitivity and linearity ratio for various MTJs with various TMR ratios. All of the MTJs have reference layers with a magnetization oriented 90° to the free layers except the MTJs for the TMR ratio of 130% having reference layers with a magnetization oriented 115° to the free layers. The linearity ratio of FIG. 1 and in TABLE 1 is over −1,000 Oe to +1,000 Oe.

TABLE 1

| TMR Ratio | Field Sensitivity (mV/Oe) | Linearity Ratio (%) |
|---|---|---|
| 200% | 0.21 | 0.83 |
| 130% rotated | 0.20 | 1.6 |
| 130% | 0.15 | 0.6 |
| 100% | 0.12 | 0.7 |

FIG. 6 and TABLE 1 show the higher the TMR ratio the higher the field sensitivity. Higher the TMR ratio causes a slight increase (i.e., worse) in the linearity ratio. Rotating of a magnetization direction of the reference layer with respect to the free layer easy axis by greater than 90°, such as by 115°, showed an increased field sensitivity but an increased (i.e., worse) linearity ratio. In the range from about −600 Oe to about +600 Oe, the signal has a low linearity ratio (i.e., high linearity) of below 1% for all TMR ratios.

Example 2

FIG. 7 shows the average magnetization rotation of the MTJ having a free layer and hard bias elements satisfying the condition (2) under micromagnetic simulation. This simulation shows that the magnetization response of the MTJ satisfying the condition (2) is hysteresis-free. Using this MTJ design in Wheatstone bridge will in turn result into a hysteresis free sensor response.

Example 3

Figure 8:
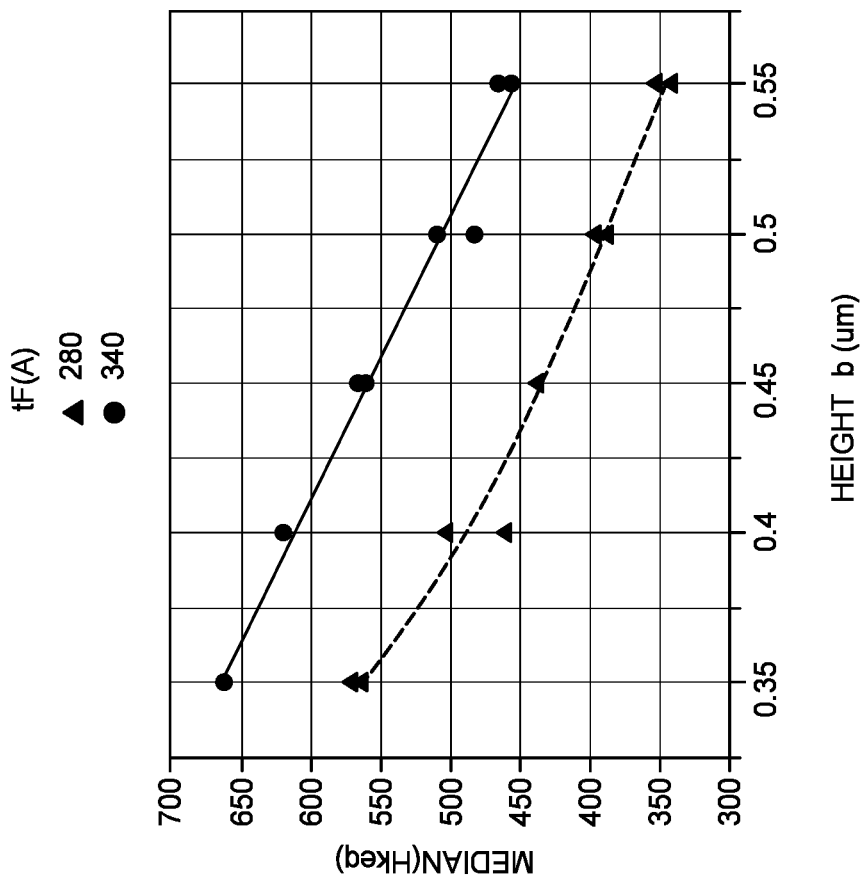
FIG. 8 shows a chart of measured magnetic saturation fields (Hk eff) of certain embodiments of a magnetoresistance leg comprising an array of MTJs of FIG. 4 connected in series.

FIG. 8 shows a chart of measured magnetic saturation fields (Hk eff) of certain embodiments of a magnetoresistance leg comprising an array of the MTJs 200 of FIG. 4 connected in series. The saturation field is determined by extrapolating the response slope of the magnetoresistance leg near a zero field to the maximum response (referred to as Hk eff).

Each of the magnetoresistance legs were fabricated to an array N of either 20 MTJs connected in series or 42 MTJs connected in series. The height 310H and width 310W of each free layer 310 were varied to adjust the saturation field in the sensing axis while maintain a constant MTJ area (i.e. resistance). The widths 302W, 304W of the HB elements 302, 304 were set to 1.5 μm. The heights 302H, 304H of the HB elements 302, 304 were adjusted to match their respective heights 310H of the free layer 310. The thickness 302T, 304T of the HB elements 302, 304 were tuned so that the $M_{HB} \parallel * t_{HB}$ product equaled $2 * M_{FL} * t_{FL}$. The thickness 310T of the free layer 310 was formed to 280 Å or to 340 Å. The resistance area product (RA) was 158 Ohm/μm$^2$ per MTJ.

As shown in FIG. 8, the saturation field and, thus, a TMR sensor of the magnetoresistance leg have a working range scaling roughly with the inverse of the height 310H of the free layer 310. The larger the thickness 310T of the free layer 310 corresponds to a higher saturation field in comparison to a free layer with the same height 310H and same width 310W.

Example 4

Figure 9:
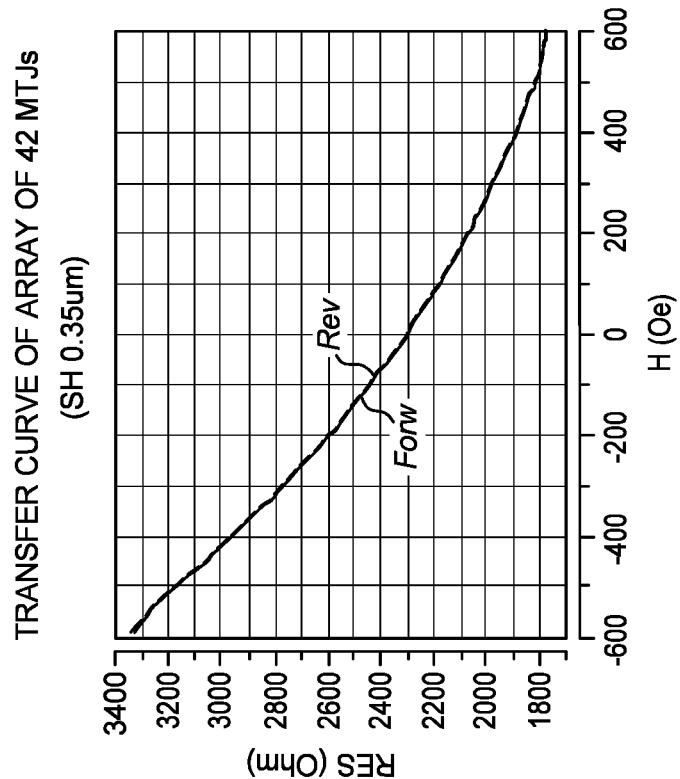
FIG. 9 is the measured transfer curve response of one of the magnetoresistance leg with an array of forty-two MTJ coupled in series of Example 3.

FIG. 9 is the measured transfer curve response of one of the magnetoresistance leg with an array of forty-two MTJ coupled in series of Example 3. Each MTJ had a free layer 310 with a thickness 310T of 280A, a height 310H of 0.35 μm, and a width 310W of 6.78 μm. The transfer curve response shows hysteresis-free behavior. Hard bias elements successfully controlled domain formation in the free layer, such as eliminating or reducing edge domain formation in the free layer. The linearity for the array was poor mainly due to the high TMR ratio (~150%).

Example 5

Figure 10:
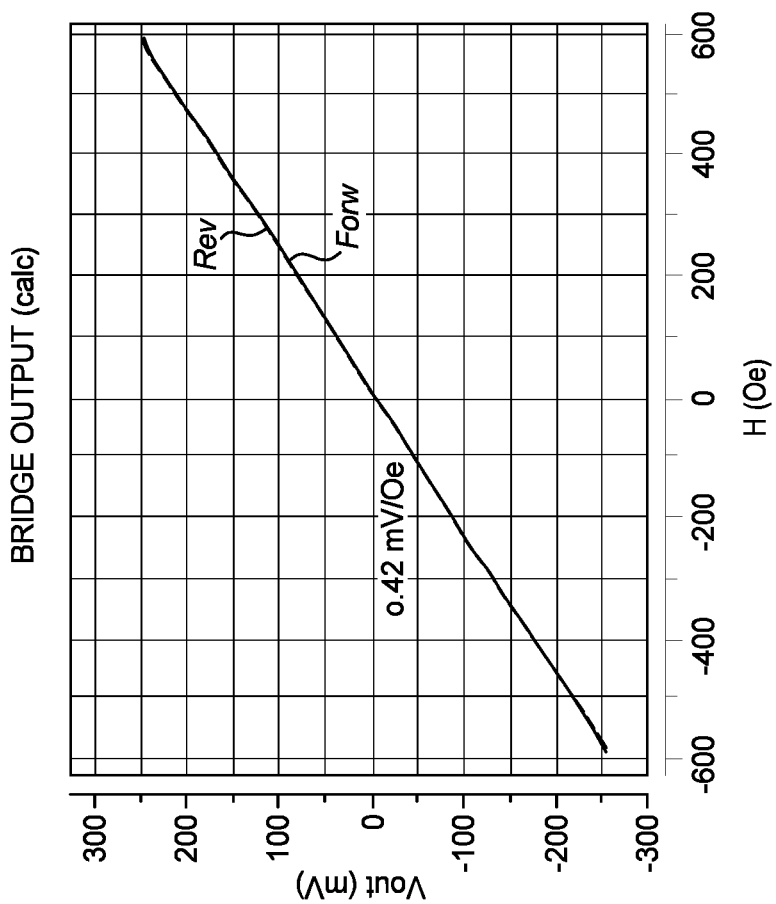
FIG. 10 is the calculated bridge output for a full Wheatstone bridge made from the two magnetoresistance legs having a positive polarity and two magnetoresistance legs having a negative polarity of Example 4.

FIG. 10 is the calculated bridge output for a full Wheatstone bridge made from the two magnetoresistance legs having a positive polarity and two magnetoresistance legs having a negative polarity of Example 4. The sensitivity was evaluated for an average voltage drop of 400 mV on each MTJ array.

The bridge response was approximately linear. The bridge output was zero at an external magnet field of 0 Oe. The Wheatstone bridge made the voltage output to be more linear and cancelled thermal drifts in comparison to the voltage output of a single magnetoresistance leg.

Example 6

Figures 11A, 11B, 11C:
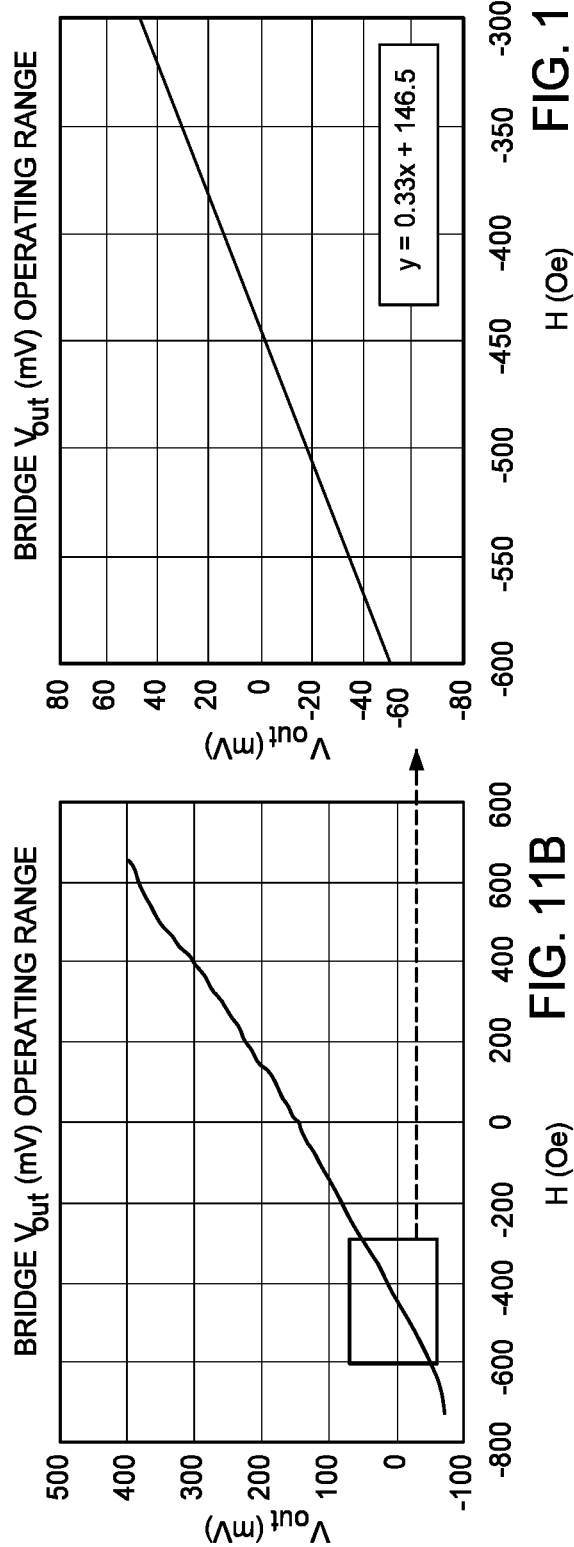
FIG. 11A is a measurement of a resistance signal of one of the magnetoresistance legs with a positive polarity and one of the magnetoresistance legs with a negative polarity in the presence of an external magnetic field.
FIGS. 11B-C are measurements of a bridge output in a full Wheatstone configuration utilizing the magnetoresistance legs of FIG. 11A in which neighboring legs have opposite polarities.

FIG. 11A is a measurement of the resistance signal of one of the magnetoresistance legs with a positive polarity and one of the magnetoresistance legs with a negative polarity in the presence of an external magnetic field to be sensed. Each leg comprises an array of forty-two MTJs coupled in series. The leg with positive polarity was formed by depositing a Film B and the leg with negative polarity was formed by depositing a Film A on the same wafer substrate in which Film A and Film B had different resistance area (RA) products.

FIG. 11B is a measurement of the bridge output in a full Wheatstone configuration utilizing the magnetoresistance legs of FIG. 11A in which neighboring legs have opposite polarities. FIG. 11C is an enlargement of a portion of FIG. 11B. In one aspect, the two film stacks with different RA product can form a Wheatstone bridge in which the voltage output is approximately zero at the desired external magnetic field. In this example, bridge voltage output is approximately zero at an external magnetic field $H_{ext}$ of −450 Oe. This bridge can sense a variable field on top of a constant DC field. The bridge output suppresses the DC component.

While the foregoing is directed to embodiments of the present disclosure, other and further embodiments of the disclosure may be devised without departing from the basic scope thereof, and the scope thereof is determined by the claims that follow.

What is claimed is:

1. A tunnel magnetoresistive (TMR) based magnetic sensor in a Wheatstone configuration, comprising:
    at least one magnetic tunnel junctions (MTJ), the at least one MTJ comprising:
        a free layer having a first edge and a second edge, the free layer having a thickness of about 100 Å or more and having a width and a height with a width-to-height aspect ratio of about 4:1 or more,
        a first hard bias element positioned proximate the first edge of the free layer; and
        a second hard bias element positioned proximate the second edge of the free layer.

2. The TMR based magnetic sensor of claim 1, wherein the width of the free layer is from about 1 μm to about 10 μm and wherein the height of the free layer is about 0.2 μm to about 2 μm.

3. The TMR based magnetic sensor of claim 1, wherein the free layer is shaped as a strip.

4. The TMR based magnetic sensor of claim 1, wherein a resistance area product of the at least one MTJ is from about 100 Ohm/μm$^2$ to about 10,000 Ohm/μm$^2$.

5. The TMR based magnetic sensor of claim 1, wherein the at least one MTJ further comprises:
    a barrier layer over the free layer;
    a reference layer over the barrier layer;
    an anti-parallel coupled layer over the reference layer;
    a pinned layer over the anti-parallel coupled layer; and
    an antiferromagnetic pinning layer over the pinned layer.

6. The TMR based magnetic sensor of claim 5, wherein a magnetization direction of the reference layer is rotated by greater than 90° with respect to an easy axis of the free layer.

7. The TMR based magnetic sensor of claim 1, wherein the at least one MTJ provides a substantially hysteresis-free response to an external magnetic field.

8. The TMR based magnetic sensor of claim 1, wherein a magnetization moment of the free layer is substantially along the width of the free layer.

9. The TMR based magnetic sensor of claim 8, wherein a magnetization direction of the first hard bias element and a magnetization direction of the second hard bias element is at angle to the magnetization moment of the free layer.

10. A tunnel magnetoresistive (TMR) based magnetic sensor in a Wheatstone configuration, comprising:
    a plurality of magnetoresistance legs, each magnetoresistance leg comprising a plurality of magnetic tunnel junctions (MTJs) coupled in series, at least one of the plurality of MTJs comprises a free layer formed as a strip with a substantially single magnetic domain provided by shape anisotropy of strip and by a first hard bias element at one end of the strip and a second hard bias element at another end of the strip.

11. The TMR based magnetic sensor of claim 10, wherein each magnetoresistance leg independently comprises the MTJs numbering from 10 to 100.

12. The TMR based magnetic sensor of claim 10, wherein a magnetization direction of the first hard bias element and a magnetization direction of the second hard bias element are rotated with respect to the substantially single magnetic domain of the free layer.

13. The TMR based magnetic sensor of claim 10, wherein the first hard bias element and the second hard bias element are fabricated in a self-aligned process with the free layer.

14. The TMR based magnetic sensor of claim 10, wherein a total combined length of the at least one of the MTJs, the first hard bias element, and the second hard bias element is from about 1 μm to about 20 μm.

15. The TMR based magnetic sensor of claim 10, wherein an output of the TMR based magnetic sensor has a linearity ratio of about 1% or less in a range from about ±600 Oe from a zero voltage output.

16. A tunnel magnetoresistive (TMR) based magnetic sensor in a Wheatstone configuration, comprising:
    two positive polarity magnetoresistance legs, each positive polarity magnetoresistance leg comprising a first plurality of magnetic tunnel junctions (MTJs) coupled in series, and
    two negative polarity magnetoresistance legs, each negative polarity magnetoresistance leg comprising a second plurality of magnetic tunnel junctions (MTJs) coupled in series,
    wherein at least one of the MTJs of the first plurality of MTJs and at least one of MTJs of the second plurality of MTJs each comprises a free layer formed as a strip with a substantially single magnetic domain provided by shape anisotropy of the strip and by a first hard bias element at one end of the strip and a second hard bias element at another end of the strip,
    wherein each of the positive polarity magnetoresistance legs and each of the negative polarity magnetoresistance legs provides a substantially hysteresis-free response to an external magnetic field.

17. The TMR based magnetic sensor of claim 16, wherein an output of the TMR based magnetic sensor has a zero voltage output when the external magnetic field is non-zero.

18. The TMR based magnetic sensor of claim 16, wherein an output of the TMR based magnetic sensor has a linearity ratio of about 1% or less in a range from about ±600 Oe from a zero voltage output.

19. The TMR based magnetic sensor of claim 16, wherein the TMR based magnetic sensor occupies a dimension from about 0.1 mm$^2$ to about 50 mm$^2$.

20. The TMR based magnetic sensor of claim 16, wherein the magnetization direction of the first hard bias element and the magnetization direction of the second hard bias element are rotated with respect to the substantially single magnetic domain of the free layer.

* * * * *